United States Patent [19]

Rippere

[11] 4,290,195

[45] Sep. 22, 1981

[54] METHODS AND ARTICLES FOR MAKING ELECTRICAL CIRCUIT CONNECTIONS EMPLOYING COMPOSITION MATERIAL

[76] Inventor: Ralph E. Rippere, 4145 W. Banff La., Phoenix, Ariz. 85023

[21] Appl. No.: 938,878

[22] Filed: Sep. 1, 1978

[51] Int. Cl.³ ............................................. H05K 3/32
[52] U.S. Cl. .................................... 29/837; 29/832; 228/248; 427/97
[58] Field of Search ................. 29/620, 627, 626, 837; 427/97; 75/212, 0.5 B; 228/248

[56] References Cited

U.S. PATENT DOCUMENTS

| | | | |
|---|---|---|---|
| 2,033,240 | 3/1936 | Hardy | 75/212 X |
| 2,286,237 | 6/1942 | Shaw et al. | 75/0.5 B |
| 3,040,119 | 6/1962 | Granzow . | |
| 3,221,387 | 12/1965 | Weller et al. | 29/627 X |
| 3,371,249 | 2/1968 | Prohofsky | 29/626 X |
| 3,529,334 | 9/1970 | Goodman et al. | 228/248 X |
| 3,561,110 | 2/1971 | Feulner et al. . | |
| 3,651,306 | 3/1972 | Glyptis | 75/212 X |
| 4,046,643 | 9/1977 | Rippere . | |
| 4,050,933 | 9/1977 | Sanderow et al. | 75/212 X |
| 4,097,266 | 6/1978 | Takahashi et al. | 75/0.5 B X |

Primary Examiner—Nicholas P. Godici
Assistant Examiner—C. J. Arbes
Attorney, Agent, or Firm—Finnegan, Henderson, Farabow, Garrett & Dunner

[57] ABSTRACT

Composition material, preferably comprising solder-coated copper particles, is loaded into a defined space which preferably comprises a hole drilled into a circuit board to expose a surface of at least one internal conductor. The loaded composition material is then compacted within the space and thereafter heated to melt only the coating sufficiently to allow at least a portion of the coating to flow onto the exposed surface of the conductor. Upon cooling, the composition material forms a compact which establishes a rigid electrical and mechanical connection between the conductor and the compact. Preferably, the compact may thereafter be drilled and component leads of an electrical device soldered or otherwise connected to the compact.

33 Claims, 7 Drawing Figures

METHODS AND ARTICLES FOR MAKING ELECTRICAL CIRCUIT CONNECTIONS EMPLOYING COMPOSITION MATERIAL

BACKGROUND OF THE INVENTION

I. Field of the Invention

The present invention relates to methods and apparatus for establishing electrical connection to at least one conductor which has an exposed surface defining in part an at least partially enclosed space. Electrical connection may also be established to at least one electrical device located outside the space. Preferably the subject methods and articles are applicable to establishing electrical contact in multilayer circuit boards.

II. Description of the Prior Art

The present day electronic device industry is based in large part on the use of printed circuits boards. In the simplest form these boards essentially comprise one sheet of plastic or other insulating base layer with layers of electrical conductors adhered to one or both sides of the sheet of plastic. The conductive layers establish various electrical circuit patterns. Holes are drilled through the sheet of plastic and conductive layers for mounting electrical devices to the broad. More sophisticated circuit boards may consist of superimposed layers of alternating plastic sheets and conductive layers laminated one on top of another to form a single structure. The conductive circuitry found in the various layers of such advanced circuit boards must be selectively interconnected in order to complete the desired circuit design. Furthermore, various conductive layers including internal conductive layers located between the laminated sheets of plastic must be capable of being selectively connected to external electrical components.

For simple printed circuit boards having adhering circuit conductors on both exposed surfaces and having a hole drilled through the board exposing a pathway between the two conductors, an interconnection between the conductors can be achieved by the employment of pressed-in conductive grommets and/or hollow rivets. The grommets or rivets are inserted into the hole and bent over at each end to provide a rigid mechanical and electrical interconnection between the circuit conductors on the exposed surfaces of the board. However, the use of pressed-in grommets and/or hollow rivets is obviously confined to double side single layer circuit boards since assured connection to internally located conductors is at best uncertain.

Perhaps the most widely commercially acceptable method of providing electrical connection to conductive circuitry in advanced circuit boards consists of forming an electroplated coating on the interior walls of the holes drilled through such advanced boards to expose surfaces of selected conductors. These coatings serve two purposes. The first purpose is to electrically interconnect conductors at various levels within the circuit boards to each other and to conductors located on the surface of the circuit boards. The second purpose is to facilitate the connection of electrical devices to selected circuit conductors on and within the circuits boards by allowing for the insertion of wire leads from these electrical devices into the electro-plated holes. Thereafter, the board is passed over an up-welling wave of molten solder and the solder is flowed up through the holes to provide surface connection between the electro-plated coating and the inserted wire leads. The metal coating of the hole wall serves as a thermally conductive pipe supplying heat drawn from the wave of molten solder to the liquid solder advancing through the hole.

While providing a mechanism for achieving fairly consistent electrical connections to internally located circuit conductors, the process of plating copper onto hole walls formed within a circuit board involves the performance of a number of mechanical, chemical, electro-chemical, photo-chemical, and sometimes plastic-lamination steps. For example, a tape-controlled machine will typically perform the drilling of the holes and thereafter panels on which the circuit board are formed are degreased, deburred by sanding, and the holes are honed with an abrasive blast before any chemical processing. The circuit board panels then enter a first chemical process line which operates to create a thin seed coating of conductive copper on the internal walls of the holes and on external copper surfaces of the circuit board. This seed coating can be between 20 to 100 or more micro inches thick depending upon the nature of the chemical baths. The seed coating is a base upon which a thicker conductive layer of copper can be electro-plated over the exposed plastic surfaces in the hole. The sequence of steps to achieve the seed coating is as follows:

(1) the panels are manually racked in the seed coating process line;
(2) a cleaner is applied to the panels through a dip process;
(3) the panels are rinsed;
(4) a conditioner is applied through a dip process;
(5) the panels are rinsed;
(6) the panels are surfaced etched through a dip process;
(7) the panels are rinsed;
(8) the panels are exposed to sulfuric acid in a dip process;
(9) the panels are rinsed;
(10) the panels are exposed to a hydrochloric acid dip;
(11) the panels are exposed to a catalyst solution dip;
(12) the panels are rinsed;
(13) the panels are re-rinsed;
(14) the panels are re-racked manually;
(15) the panels are acid dipped;
(16) the panels are rinsed;
(17) the panels are exposed to an alkaline copper solution dipping;
(18) the panels are rinsed;
(19) the panels are re-rinsed; and
(20) the panels enter an acid holding tank.

At this point the entire panels, all surfaces, edges, and hole walls have been coated with metallic copper in thickness sufficient to be an effective conductive seed coating to plate on a final layer of copper. The sequence of steps to achieve the copper plating is as follows:

(21) the panels are transferred manually to a plating rack;
(22) the panels are dipped into an acid bath;
(23) the panels are rinsed;
(24) plating is commenced at a low current density;
(25) plating is continued at an increased current density;
(26) the panels are rinsed;
(27) the panels are dried;
(28) the panels are unracked manually.

Of the 28 steps identified above, four involve manual operations and the remainder could be manual or automated under tape or computer control. These 28 steps result in a coating of copper of 1 to perhaps 2 mils thick. The coating serves to establish contact from outer conductive surface to outer conductive surface or from outer conductive surface to an internal exposed conductor and acts as a thermal conductor during a subsequent wave soldering step. This brief description of a presently commercially available method of providing electrical contact to an internal circuit conductor of a printed circuit board does not include consideration of the financial, solution control, rinse water supply control, waste solution disposal control, or other logistic considerations needed to maintain a high yield production schedule.

Although not known to be commercially viable, alternative methods of providing electrical connection to internally located conductors in a printed circuit board have been disclosed in issued U.S. patents. For example, in U.S. Pat. No. 3,040,119 issued to *Granzow,* an electrical circuit board is disclosed in which powdered or grandular grains or particles of an electro-conductive metal are compressed under pressure into each hole of a circuit board. Preferably, particles of copper are disclosed as being employed in conjunction with any suitable mechanism which is capable of tightly compressing the metal particles into holes within the circuit board so that the particles will be solidified into a rigid mass and permanently anchored in the holes. It is also taught in Granzow that the compressed solidified particles may be established in the form of a sleeve or cylinder lining the hole of the circuit board and that the lead of an electrical device may be inserted in the middle of the sleeve or cylinder and solder run down into the sleeve or cylinder to thereby make a solder connection between the lead of the electric device and printed circuit conductors on the surface of the printed circuit board. A primary disadvantage of such a method resides in the reliance on a pure mechanical connection between the exposed conductors on the printed circuit board and the compressed particulate mass.

In U.S. Pat. No. 3,158,503 issued to Young a flowable metal paste in the form of a thick "cream" containing silver powder is wiped across the surface of a first board to fill a hole within the board. The hole of the first board is then aligned over a hole of a second board and jets of compressed air are passed over the first board to force the silver paste onto the inner surface of the hole of the second board. This and other methods of depositing a paste held in a fluid bind all suffer from the deficiency of reduced conductivity due to contact of the non-conductive binder against the exposed surface of the circuit board conductor.

U.S. Pat. No. 3,561,110 issued to Feulner et al. attempts to overcome the deficiency of such prior art methods of providing conductive paths through very small vertical and/or transverse holes in non-metallic bodies such as printed circuit boards by filling such holes with metallic particles ranging from approximately 0.5 to 3 mil in diameter and then sintering the dry metal particles. Feulner et al. further teaches that a molten metal such a solder may be applied to the sintered-produced conductive plug at the surface of the hole and allowed to permeate through the spaces between the sintered particles. This particular method has the disadvantage of having to subject the nonmetallic portions of the printed circuit board to a sufficiently high temperature for a sufficiently long amount of time to achieve the sintering of the metallic particles. In addition, subsequent application of a molten media such as solder to the surface of the hole would appear to result in only a limited flow throughout the sintered particles.

The teachings of U.S. Pat. No. 3,616,532 issued to Beck attempt to resolve the difficulties of providing an electrical connection to internally exposed conductors in a printed circuit board through the employment of a spring held in compressed state by a coating of solder. The compressed spring is inserted into an aperture in an insulating substrate which is positioned between layers of circuitry which are to be inter-connected. Upon heating, the solder is reported to melt to permit the spring to expand and thereby establish contact between the conducted surfaces. When the solder again cools, the connection is reportedly established. The obvious limitations of such a method of inter-circuit connection lie in the difficulty of accurately aligning such spring assemblies with small diameter circuit board interconnecting holes. Furthermore, an inventory of springs of various diameters and lengths is inevitably required.

U.S. Pat. No. 3,999,004 issued to Chirino et al. approaches the problem by positioning a metal paste within holes of a circuit board by mounting the circuit board on a rotatable wheel. The wheel is then spun to subject the paste to centrifugal forces which reportedly acts to remove excess paste and to uniformly and evenly coat the interior side walls of holes in a laminar stack. This approach not only suffers from the above-mentioned diffusing inherent in all "metal paste" methods but also requires that the board be subjected to substantial mechanical forces.

The above-mentioned attempts at providing electrical circuit connections to printed circuit boards are representative of attempts to devise an economically suitable solution to the problem which fall short of success.

It is, accordingly, an object of the present invention to provide methods and apparatus for achieving electrical connections to internal conductors of circuit boards which are highly reliable.

It is another object of the present invention, to provide methods and apparatus for producing suitable internal circuit board electrical connections with elimination of many of the steps and expenses inherently involved with copper-electro plating electrical connections.

It is still another object of the present invention to provide a means for simply and efficiently coupling electrical device to the internal conductors of a circuit board which does not subject the circuit board to high temperature, destructive chemicals and/or substantial mechanical forces.

Additional objects and advantages of the invention will be set forth in part in the description which follows, and in part will be obvious from the description, or may be learned by practice of the invention. The objects and advantages of the invention may be realized and obtained by means of the instrumentalities and combinations particularly pointed out in the appended claims.

SUMMARY OF THE INVENTION

To achieve the foregoing objects, and in accordance with the purposes of the invention as embodied and broadly described herein, the method for making an electrical circuit connection to at least one conductor which conductor has an exposed surface defining in part an at least partially enclosed space of the present invention comprises the steps of: (a) loading discrete composition particles into the space, the composition particles each comprising first and second electrically conductive components, the second component having a lower melting point than the first component; (b) forming a compact of the particles for contacting the exposed surface of the conductor with the composition particles and for resisting the sagging of either of the first and second components under the force of gravity upon the melting of only the second component; (c) heating the particles to melt only the second component sufficiently to allow at least a portion of the second component to flow onto the exposed surface of the conductor; and (d) cooling the particles to form a rigid electrical and mechanical connection between the conductor and the compact. Preferably, the step of compacting results in lateral expansion of the compact within the space.

The invention expressly includes the above method wherein: (i) the first component is a first metal having a first melting point and the second component is a second metal having a second lower melting point; (ii) the first component is a metal having a first melting point and the second component is an alloy having a second lower melting point; (iii) the first component is copper and the second component is a tin and lead solder; and (iv) the first component is brass the the second component is a tin and lead solder. It is also expressly within the scope of the present invention wherein the method set out above employs particles which are dendritic. For example, the first component may comprise a dendritic core and the second component may comprise a lower melting point conductive coating individually covering each dendritic core.

In a more narrow sense, applicant's invention describes a method for making an electrical circuit connection to at least one conductor and to at least one electrical device wherein the method includes the steps set out above and further includes the step of mounting an electrical device to the compact. Preferably, the step of mounting an electrical device to the compact includes the substeps of drilling a hole into the particles after the step of cooling, inserting a conductive portion of the electrical device into the hole, reheating the particles to melt only the second component sufficiently to allow at least a portion of the second component to flow onto the conductive portion of the electrical device, and cooling the particles to form a rigid electrical and mechanical connection between the conductor and the electrical device. Preferably, the step of mounting may further include the substep of introducing an additional conductive component into the hole adjacent the conductive portion of the electrical device.

The step of mounting may, in the alternative, include the substep of inserting a conductive portion of the electrical device into the space prior to the step of forming a compact. In this case the step of heating includes heating the particles sufficiently to also allow at least a portion of the second component to flow onto the conductive portion of the electrical device and the step of cooling the particles further forms a rigid electrical and mechanical connection between the conductor and the electrical device.

In still another sense, applicant's method for making an electrical circuit connection to at least one conductor which conductor has an exposed surface and which surface in part defines an at least partially enclosed space includes the steps of (a) compacting an electrically conducting filament into the space, the filament having a coating of a material which exhibits a lower melting point than the melting point of the filament, the compacting step continuing until at least a substantial portion of the space is filled with a random distribution of the filament sufficiently dense to assure physical contact of some portion of the coating with the exposed surface of the conductor; (b) heating the random distribution to melt only the coating sufficiently to allow at least a portion of the material of the coating to flow onto the exposed surface of the conductor; and (c) cooling the random distribution to form a rigid electrical and mechanical connection between said conductor and said compact.

Another aspect of applicant's invention also describes a method for making an electrical circuit connection to at least one conductor which conductor has an exposed surface and which surface in part defines an at least partially enclosed space comprising the steps of: (a) heating composition particles, which particles comprise first and second electrically conductive components with the second component having a lower melting point than the first component sufficient to melt only the second component; (b) loading the heated particles into the space in random distribution; (c) compacting the heated particles to form a compact to resist sag upon melting of the second component and to assure that at least a portion of the second component flows onto the exposed surface of the conductor; and (d) cooling the particles to form a rigid electrical and mechanical connection between the conductor and the compact.

Applicant's invention also encompasses the resulting article of manufacture and specifically encompasses an electrical circuit connection to at least one conductor which conductor has an exposed surface and which surface in part defines an at least partially enclosed space, the connection comprising a compact of electrically conductive particles, each particle having a core and each particle having an individual coating of an electrically conductive material, the coating having a melting point lower than the melting point of the core, and at least a portion of the coating being in physical contact with the exposed surface of the conductor.

Finally, applicant's invention also expressly includes an electrical circuit connection to a conductor comprising a compact of electrically conductive composition located adjacent the conductor, the composition being comprised of first and second electrically conductive components, the first component being randomly dispersed throughout the compact and being covered by the second component and the second component having a lower melting point that the first component, and the first component forming a physical structure which retains its shape upon melting of the second component.

In the above-mentioned articles it is expressly within the scope of the present invention to employ: (i) a first metal having a first melting point and a second metal having a second lower melting point; (ii) a first metal having a first melting point and an alloy having a second lower melting point; (iii) copper and a tin and lead solder; and (iv) brass and a tin and lead solder. Furthermore, in the above articles dendritic particles may expressly be employed.

BRIEF DESCRIPTION OF THE DRAWINGS

The accompanying drawings, which are incorporated and constitute a part of the specification, illustrate examples of the preferred embodiment of the invention and, together with the general description of the invention given above and the detailed description of examples of the preferred embodiment given below, serve to explain the principles of the invention.

The above general description and the following detailed description are merely illustrative of the generic invention and additional modes, advantages, and particulars of this invention will be readily suggested to those skilled in the art without departing from the scope and spirit of the invention.

DESCRIPTION OF THE PREFERRED EMBODIMENT

Reference will now be made in detail to the present preferred embodiment of the invention, examples of which are illustrated in the accompanying drawings.

Broadly, the present invention relates to methods and apparatus for making an electrical circuit connection to at least one conductor which conductor has an exposed surface defining in part an at least partially enclosed space. The at least one conductor to which the methods and apparatus of the present invention make electrical circuit connection may, for example, comprise at least one electrical conductor in a standard circuit board. However, the invention is by no means intended to be limited to employment with circuit boards and may be employed to provide electrical circuit connection to any conductor which conductor has a exposed surface defining in part an at least partially enclosed space. Other express non-limiting examples in which the present invention may be employed include connection within a portion of an electrical component or a connection in conjunction with a semiconductor substrate.

Figure 1:
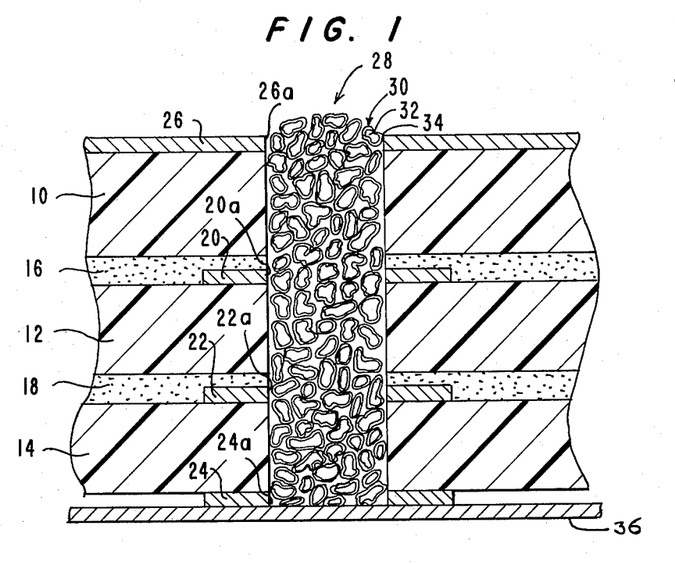
FIG. 1 schematically and in cross-section illustrates the step of loading discrete composition particles into a space in accordance with the teachings of the present invention.

For purposes of illustration and not limitation, attention is called to FIG. 1 wherein a standard circuit board configuration is illustrated. The circuit board is shown to comprise a plurality of plastic layers 10, 12 and 14 mounted one above the other by interposed adhesive layers 16 and 18. As shown in FIG. 1, each plastic layer 10, 12, and 14 also has mounted on it a copper conductor 20, 22, and 24 respectively. In addition, a copper conductor layer 26 is also shown affixed to the upper surface of plastic layer 10. Each copper conductor 20, 22, 24, and 26 is illustratively shown in FIG. 1 to have an exposed surface 20a, 22a, 24a and 26a respectively defining in part an at least partially enclosed space 28. Partially enclosed space 28 is also known in the printed circuit art as a via hole. Space 28 may be open or closed at one end and may lie perpendicular to the planes of the plastic layers as shown or at some other angle, such as transverse to the layers.

The function of space 28 as shown is to provide a communication channel between the various copper conductors 20, 22, 24, and 26. For example space 28 may provide a communication channel to internal copper conductors 20 and/or 22. In the alternative or in addition, space 28 provides a communication channel from copper conductor 24 located on one surface of the printed circuit board to the upper surface of the printed circuit board on which copper conductor 26 is located. Copper conductors 20, 22, 24 and 26 may, for example, provide circuit interconnects on the various plastic layers 10, 12 and 14 on one or both sides. Some suitable and standard dimensions in current practices for the thickness of copper layers 20, 22 and 24 might fall between one to three mils to thickness while plastic layers 10, 12 and 14 might typically be between 10 to 30 mils thick. The three plastic layers 10, 12 and 14 illustrated in FIG. 1 may be stacked and registered on pins in a suitable metal jig or holder plate. Plastic layers 10, 12 and 14 may, for example, comprise plastic insulation bases of a rigid type comprised of epoxy-phenolic with woven fiberglass cloth reinforcement. Plastic layers 10, 12 and 14 may, in the alternative, comprise flexible cables or flexible extensions such as sheet polyimide (Dupont Kapton), Teflon ® and/or fiber glass. Adhesive layers 16, 18 may, for example, comprise layers of fiberglass impregnated with a partially polymerized or semi-advanced plastic or adhesive such as polymerized advance epoxy glass or a poly-acrylo-nitrile substance. The resultant assembly illustrated in FIG. 1 may be achieved by the process of pressing with heating to bond the layers into a single panel as is well known to those skilled in the art.

The above description of the printed circuit board illustrated in FIG. 1 is well known in the art and the particular description may of course be substituted and modified in accordance with acceptable circuit board technology.

It is the challenge of providing an economically feasible and mechanically and electrically reliable interconnection between at least one conductor such as copper conductors 20, 22, 24, and 26 which is the object and goal of the present invention.

In accordance with the present invention, a method for making an electrical circuit connection to at least one conductor which conductor has an exposed surface defining in part an at least partially enclosed space, includes the step of loading discrete composition particles into said space, said composition particles each comprising first and second electrically conductive components, the second component having a lower melting point than the first component.

The first component preferably is a first metal having a first melting point and the second component is preferably a second metal having a second lower melting point or, the first component is preferably a first metal having a first melting point and the second component is an alloy having a second lower melting point. Specific preferred examples of the discrete composite particles include the first component being copper and the second component being a tin and lead solder and the first component being brass and the second component being a tin and lead solder.

It is also preferred that the particles are dendritic, that is to say it is preferred that the particles assume an acicular, grainy, or fern shape. It is also preferred, and within the intended scope of the present invention, that the particles each has a dendritic core and an individual coating of electrically conductive material over said core, the coating having a lower melting point than the melting point of the core. In this specific case, the core comprises the above-mentioned first component and the coating comprises the above-mentioned second component.

Preferably, the composition particles to be loaded into the space are particles manufactured in accordance with the teachings of my U.S. Pat. No. 4,046,643 issued Sept. 6, 1977. U.S. Pat. No. 4,046,643, which continues to be owned in its entirety by me, is in its entirety herein expressly incorporated by reference. In addition, the above-mentioned and expressly herein incorporated U.S. Pat. No. 4,046,643 in turn makes reference to and expressly incorporates by reference my previous U.S. Pat. No. 3,994,985 issued Nov. 30, 1976. U.S. Pat. No. 3,994,985, which also continues to be owned in its entirety by me, is also in its entirety herein expressly incorporated by reference. My Continuation-in-part Application U.S. Pat. No. 4,046,643, namely U.S. Ser. No. 815,762, filed July 14, 1978 which has been allowed but has not yet issued is also owned in its entirety by me and is hereby in its entirety herein expressly incorporated by reference.

Particular examples of the size and composition of suitable discrete composition particles to be loaded in accordance with the present invention into a space defined at least in part by an exposed surface of a conductor, are set out in the examples set forth below.

As illustratively shown in FIG. 1, discrete composition particles 30 are loaded into partially enclosed space or via hole 28. Each of composition particles 30 is illustratively shown to comprise a first component 32 and a second component 34. As is preferred, first component 32 comprises a dendritic core and second component 34 comprises an individual coating of an electrically conductive material over core 32. Second component 34 may comprise a material such as a tin and lead solder which has a lower melting point than the first melting point of first component 32 which may, for example, comprise a material such as copper or brass. Dendritic shaped particles, such as dendritic copper powder have, of course, been generally known for some time as, for example, is evidenced by the Article of Drumiler et al. Entitled "Electrodeposition of Copper Powder from Acid Sulfate Baths", Vol. 42, No. 10, Industrial and Engineering Chemistry, October 1950, pages 2099–2102.

Figure 2:
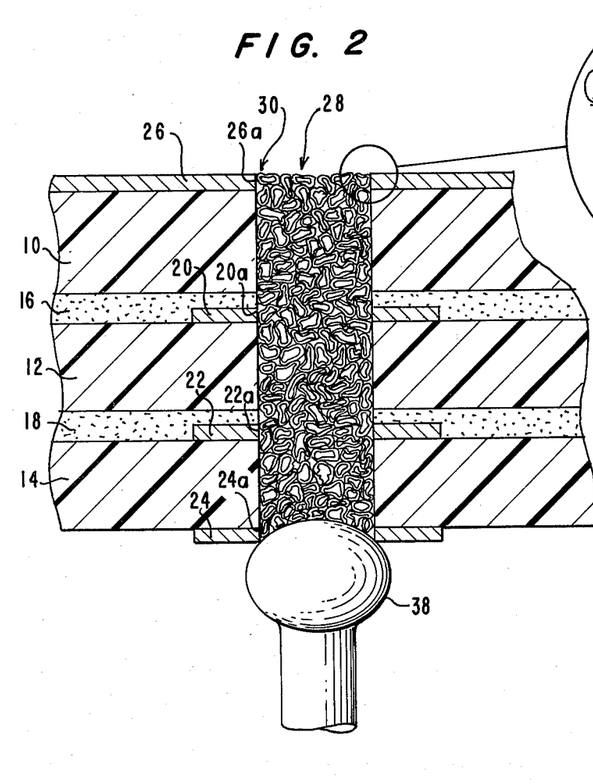
FIG. 2 schematically and in cross-section illustrates an electrical circuit connection formed prior to the step of heating in accordance with the teachings of the present invention.

A suitable stopping plate 36 may be employed to temporarily enclose a lower opening of space 28 to prevent initial loss of particles 30 and allow for completion of the step of loading. Stopping plate 36 may be of flat configuration as illustrated in FIG. 1, or may, in the alternative, comprise a rounded or spherical shape as illustrated by stopping plug 38 as shown in FIG. 2. Use of plug 38 results in formation of an inwardly directed concave surface of composition particles 30 whereas use of stopping plate 36 results in an essentially planar bottom surface of composition particles 30.

In accordance with the present invention, my method for making an electrical circuit connection further includes the step of forming a compact of said particles for contacting said exposed surface of said conductor with said composition particles and for resisting the sagging of either of said first and second components under the force of gravity upon melting of only said second component.

In the specific example illustrated in FIG. 1, the step of compacting may be performed by asserting pressure to the top of composition particles 30 which fill space 28 while maintaining the positioning of stopping plate 36 or plug 38 to prevent loss of composition particles 30 from the bottom of space 28. Of course, in the event space 28 is enclosed at the lower portion, it is unnecessary to employ stopping plate 36, plug 38 or any similar device to prevent loss of particles 30 either during the step of loading the discrete composition particles or during the step of forming a compact.

The step of forming a compact may include refilling the enclosed space 28 after initial compression of particles 30 followed by reapplication of compression to bring the resultant compact to the top of space 28 or slightly above the opening of space 28 as is illustrated in FIG. 2.

In accordance with my invention, the step of compacting preferably results in lateral expansion of said compact within said space.

As illustrated in FIG. 2, the use of plug 38 to close the bottom of space 28 coupled with the downward exertion of force against particles 30 filling space 28 results in the lateral expansion of the compact comprised of particles 30 against the lateral walls defining space 28 including the exposed surfaces 20a, 22a, 24a 26a of conductors 20, 22, 24 and 26. Thus, the forming of a compact assures physical contact of at least a portion of particles 30 with the exposed surfaces 20a, 22a, 24a, and 26a of conductors 20, 22, 24, and 26.

When particles 30 preferably comprise an inner dendritic core covered by a lower melting point coating, it is preferable that the coating comes in contact with the exposed surfaces 20a, 22a, 24a, and 26a. Furthermore, the preferred employment of dendritic shaped particles 30 results in an intermeshing and interweaving of particles during the step of forming a compact which resultant formation of dendritic particles strongly resists sagging of either the inner dendritic core or the outer lower melting point solder under the force of gravity even upon subsequent melting of the outer coating.

In the event non-dendritic particles are employed, for example, particles which assume an essentially spherical shape, the size of the particles with respect to the dimensions of space 28, and the magnitude of the second component or coating which surrounds the first component, dictates the degree to which the resultant compact resists sagging of either of the first and second components under the force of gravity upon melting of only the second component. For example, if the second component comprises a relatively thin coating of tin lead solder over an internal first core of copper, with the solder and copper achieving a three to one hundred ratio by weight the resultant compact will substantially resist sagging of either of the first and second components under the force of gravity upon melting of only the second component. However, if the magnitude of the second component substantially surpasses the ratio of ten to one hundred by weight, the second component when melted may form a lubricant for the first component of such magnitude that at least a partial sagging may result upon melting of only the second component. It is for this reason that the first component and therefore the resultant particles preferably assume a dendritic form.

Further in accordance with the present invention, my method for making an electrical circuit connection further includes the step of heating said particles to melt only the second component sufficiently to allow at least a portion of the second component to flow onto said exposed surface of the conductor.

The step of heating the particles to melt only the second component may, for example, be achieved by placing one or more drops of hot solder upon the top of the compact formed of particles. In the alternative, direct solder iron contact will also achieve the desired step of heating said particles. It is certainly within the intended scope of the present invention to include all other suitable methods of heating said particles, including, for example, employment of electrical resistance heating. The key to the step of heating said particles is to apply only that amount of heat sufficient to allow at least a portion of the second components to flow onto the exposed surfaces of the conductors.

Figure 3:
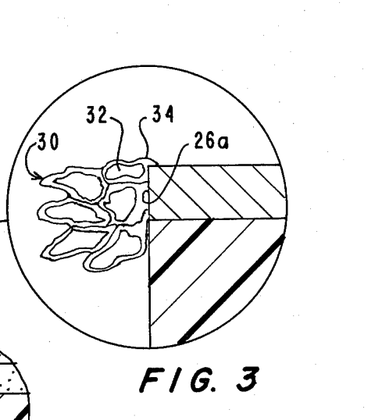
FIG. 3 illustrates an enlarged portion of the electrical circuit connection shown in FIG. 2 subsequent to the step of heating.

Thus, with reference to FIG. 2, only an amount of heat should be applied to particles 30 sufficient to melt second component 34 enough to have a portion of second component 34 flow onto exposed surfaces 20a, 22a, 24a, and 26a of conductors 20, 22, 24, and 26. To illustrate this point, an enlargement of the portion of FIG. 2 within circle A is illustrated in FIG. 3 which shows how second component 34 may be melted to flow upon at least one exposed surface of a conductor illustrated in FIG. 3 as surface 26a. It may also be noticed by reference to FIG. 3 that by employing a dendritic first component 32 as the core of particles 30 a rigid structure is developed during the step of forming the compact which structure resists sagging of either first component 32 and second component 34 upon melting of only second component 34. By employing dendritic-shaped first component 32 the available paths through which second component 34 may sag out of hole 28 when second component 34 is in the liquid state are also severely limited.

The degree to which sag is eliminated is of course a function of the particular shape of particles 30 employed, the amount of compacting achieved during the step of forming a compact, and the ratio of second component 34 employed with respect to first component 32 and the composition of the second component 34.

For example, when second component 34 is solder as used in the radio industry (64% tin-36% lead) the solder melts directly into a liquid enhancing the probability that sag will occur, while other compositions of solder exhibit a less fluid property and hence are more resistant to sag. In any case, use of dendritic shaped first component 34 essentially eliminates sag regardless of the other factors involved.

The examples set out below provide specific indications of suitable parameters of these variables which achieve a desired compact which resists sagging of either the first and second components under the force of gravity upon melting of only the second component.

As shown in FIG. 3, it is the solidified flow of the melting second component 34 over the exposed surface of copper conductor 26 upon cooling which assures rigid mechanical and electrical connection by means of particles 30. Thus, generically stated and in accordance with the present invention, my method for making an electrical circuit connection includes the step of cooling said particles to form a rigid electrical and mechanical connection between the conductor and the compact.

It is of course to be understood that the above-described method is not limited to forming a single electrical connection with only a single conductor but rather may be satisfactorily employed with any number of conductors having exposed surfaces defining in part an at least partially enclosed space. It is further within the contemplation of the present invention that the disclosed method may provide an electrical circuit connection not only to at least one conductor which conductor has an exposed surface defining in part an at least partially enclosed space but also to at least one electrical device. This method includes the above-described steps of loading discrete composition particles into said space, forming a compact of said particles, heating said particles to melt only said second component, and cooling said particles to form a rigid electrical and mechanical connection, and also includes the further step of mounting an electrical device to said compact. There will hereinafter be disclosed two illustrative but non-limiting examples of the step of mounting an electrical component to said compact.

In the first preferred example, the step of mounting includes the substeps of drilling a hole into said particles after said step of cooling, inserting a conductive portion of said electrical device into said hole, reheating said particles to melt only said second components sufficiently to allow at least a portion of said second component to flow onto said conductive portion of said electrical device, and cooling said particles to form a rigid electrical and mechanical connection between said conductor and said electrical device.

Figure 4:
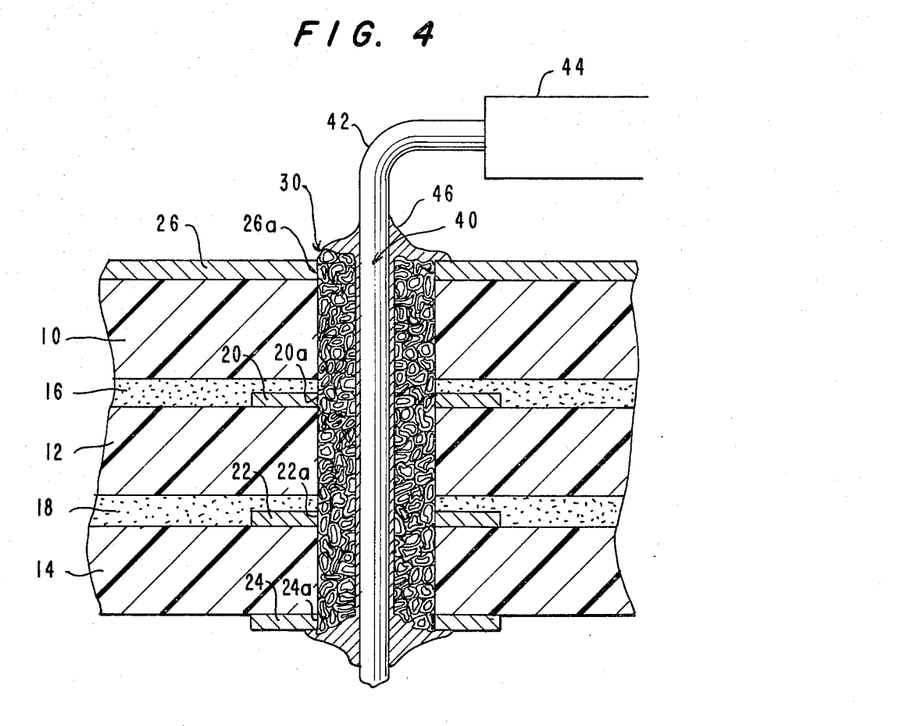
FIG. 4 shows schematically and in cross-section an electrical circuit connection to at least one electrical device constructed in accordance with the teachings of the present invention.

For example, as illustratively shown in FIG. 4, a hole 40 may be drilled or otherwise formed in the compact formed of particles 30. Hole 40 preferably has substantially the same diameter as a conductive portion 42 of an electrical device 44. Accordingly, conductive portion 42 of electrical device 44 may be inserted into hole 40. Thereafter, particles 30 may be reheated without fear of resultant sag to again melt only second component 34 of particles 30 sufficient to allow at least a portion of second component 34 to flow onto conductive portion 42 of electrical device 44. Thus, upon cooling of particles 30 and resolidification of second component 34, a rigid electrical and mechanical connection is formed between conductors 20, 22, 24, and 26 and electrical device 44.

Preferably the step of mounting further includes the substep of introducing an additional conductive component into said hole adjacent said conductive portion of said electrical device.

The additional conductive component may take on various forms in accordance with the present invention. For example, as illustrated in FIG. 4, additional tin and lead solder 46 may be introduced into hole 40 adjacent conductive portion 42 of electrical device 44. Additional lead and tin solder 46 may be tinned to conductive portion 42 prior to insertion of conductor portion 42 into hole 44. In the alternative and/or in addition, additional tin and lead solder 46 may be applied after insertion of conductive portion 42 into hole 40 and allowed to flow through hole 40.

Figure 5:
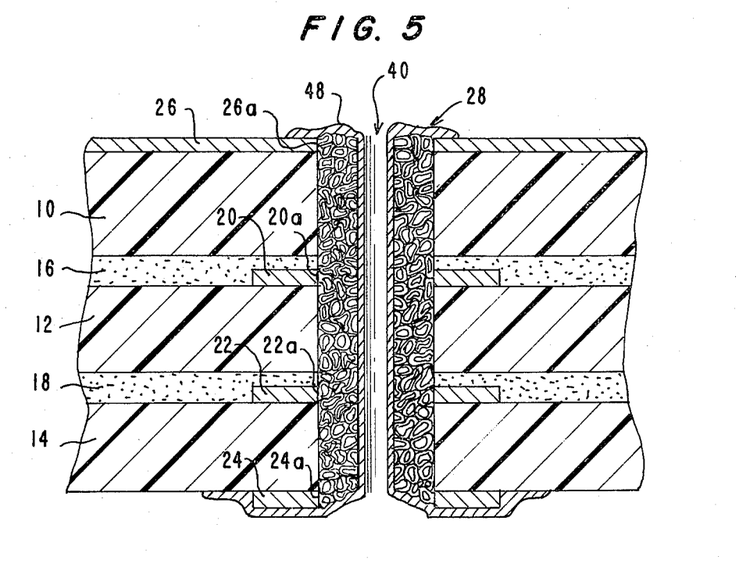
FIG. 5 shows schematically and in cross-section a view of an electrical circuit connection prepared for the receipt of an electrical device in accordance with the teachings of the present invention.

An alternative additional conductive component is illustrated in FIG. 5 as comprising a copper plating 48 coating to at least the interior surfaces of hole 40. Since copper plating 48 here adheres to the walls of hole 40 which comprise compacted conductive particles 30, the forming of copper plating 48 may be accomplished without the difficulties inherent in the prior art plating of space 28 absent the compact formed of particles 30. For example, there is no critical connection points at which conductive surfaces 20a and 22a must come in contact with copper plating 48 in order to assure electrical continuity to internal conductors 20 and 22 as would be required is the absence of the compact formed of particles 30. All that is now required is that some electrical and mechanical connection be achieved between portions of copper plating 48 and portion of the compact formed of particles 30.

After the formation of copper plating 48, an electrically conductive portion 42 of an electrical device 44 may be inserted into the interior of copper plating 48 to achieve mounting of an electrical device 44 to the circuit board in the manner illustrated above with regard to FIG. 4. As also illustrated with respect to FIG. 4, an additional lead and tin solder 48 may accompany conductive portion 42 to facilitate the electrical and mechanical connection of conducting portion 42 to the internal walls of copper plating 48 illustrated in FIG. 5.

The above-described generic step of mounting an electrical device to said compact may, in the alternative and in accordance with the present invention, include the substep of inserting a conductive portion of said electrical device into said space prior to said step of forming a compact. In this case, said step of heating includes heating said particles sufficiently to also allow at least a portion of said second component to flow onto said conductive portion of said electrical device and said step of cooling said particles further forms a rigid electrical and mechanical connection between said conductor and said electrical device.

Figure 6:
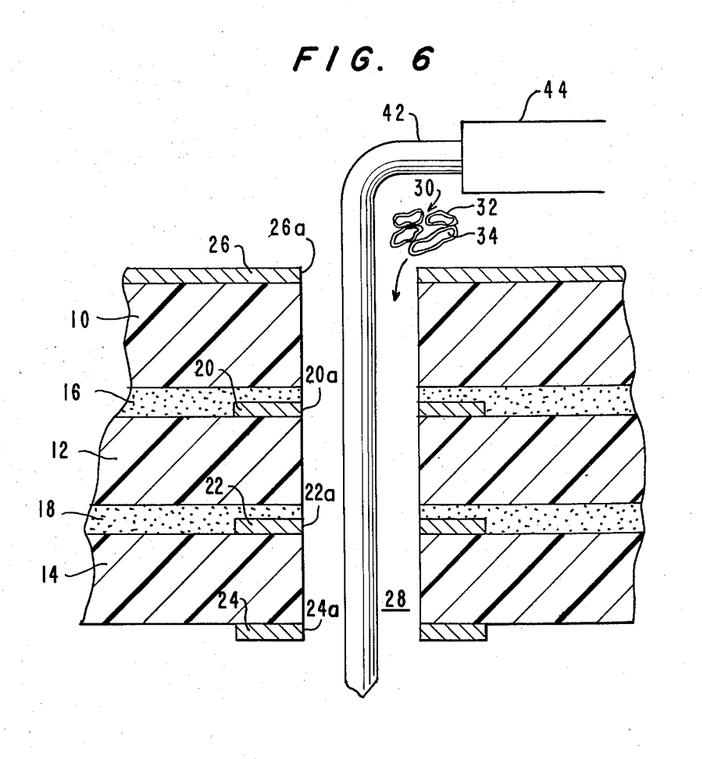
FIG. 6 shows schematically and in cross-section the step of mounting an electrical device including the substep of inserting a conductive portion of the electrical device into a space prior to the step of forming a compact in accordance with the teachings of the present invention.

One example of this alternative method of mounting an electrical device is illustratively shown in FIG. 6. In FIG. 6 an electrically conductive portion 42 of an electrical device 44 is shown inserted into space 28 prior to loading space 28 with any particles 30. Subsequent to the positioning of conductive portion 42 into space 28 particles 30 may be used to fill space 28 and thereafter the steps of compacting, heating and cooling may be performed. In the alternative, space 28 may be previously filled with particles such as particles 30 and thereafter but prior to the step of compacting, electrical conducting portion 42 of electrical device 44 may be inserted into space 28. It is also possible and within the intended scope of the present invention to compact at least a portion of particles 30 around electrical conduction portion 42 prior to insertion of electrically conductive portion 42 into space 28.

There are within the scope of the present invention a number of alternative methods for making an electrical circuit connection in addition to those expressly set out above. For example, the step of heating said particles may be performed prior to the steps of loading the particles and/or compacting the particles. Specifically, in accordance with the present invention, my method for making an electrical circuit connection to at least one conductor which conductor has an exposed surface and which surface in part defines an at least partially enclosed space may comprise the first step of heating composition particles, which particles comprise first and second electrically conductive components with said second component having a lower melting point than said first component, sufficiently to melt only said second component followed by the steps of loading said heated components into said space in a random distribution, compacting said heating components, and cooling said compacted heated components to form a rigid electrical and mechanical connection between said conductor and said compact.

Figure 7:
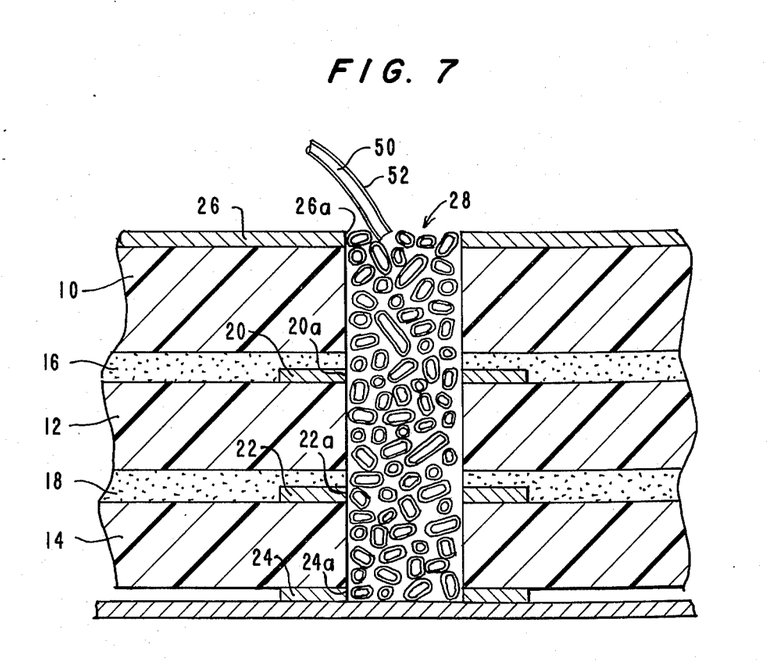
FIG. 7 shows schematically and in cross-section the step of compacting an electrically conductive filament into a space in accordance with the teachings of the present invention.

In still another alternative method the electrically conductive particles may be replaced with an electrically conductive filament such as filament 50 illustrated in FIG. 7. Filament 50 may, for example, comprise a thin wire of copper of other suitable electrically conductive material or may in fact comprise a thin malleable copper foil or strip. Filament 50 has a coating 52 of a material which exhibits a lower melting point than the melting point of said filament. Coating 52 may, for example, comprise a thin and lead solder or other alloy which has a lower melting point than filament 50.

Thus, in accordance with the present invention, one method for making an electrical circuit connection comprises the steps of compacting an electrically conductive filament into said space, said filament having a coating of material which exhibits a lower melting point than the melting point of said filament, said compacting continuing until at least a substantial portion of said space is filled with a random distribution of said filament sufficiently dense to assure physical contact of some portion of said coating with said exposed surface of said conductor.

As illustrated in FIG. 7 filament 50 with coating 52 is in the process of being compacted into space 28 to form a random distribution within space 28.

In accordance with the present invention this method for making an electrical circuit connection further comprises the steps of heating said random distribution to melt only said coating sufficiently to allow at least a portion of said material of said coating to flow onto said exposed surface of said conductor; and cooling said random distribution to form a rigid electrical and mechanical connection between said conductor and said compact. As illustrated in FIG. 7, for example, upon completion of compacting filament 50 into space 28, heat may be applied to the resultant compact sufficiently to melt only coating 52 and allow at least a portion of coating 52 to flow onto exposed surfaces 20a, 22a, 24a, and 26a of conductors 20, 22, 24, and 26.

The resultant electrical connection of the abovedescribed method is also intended to be within the scope of the present invention. Accordingly, the present invention also comprises an electrical circuit connection to at least one conductor which conductor has an exposed surface and which surface in part defines an at least partially enclosed space, said connection comprising a compact of electrically conductive particles each particle having a core and each particle having an individual coating of an electrically conductive material, said coating having a melting point lower than the melting point of said core, and at least a portion of said coating being in physical contact with said exposed surface of said conductor.

One example of such an electrical circuit connection is illustrated in FIGS. 3 and 4 wherein at least one of conductors 20, 22, 24, and 26 has an exposed surface 20a, 22a, 24a and 26a which helps define an at least partially enclosed space 28 FIGS. 3 and 4 further illustrates a compact formed of compressed composition particles 30 with each particle having a first component 32 illustrated as a core and a second component 34 illustrated as an individual coating of electrically conductive material. As explained above, the coating comprised of the second component has a melting point lower than the melting point of the core comprised of the first component. As also explained above, at least a portion of the coating comprised of second component 34 is in physical contact with an exposed surface of conductors 20, 22, 24, and 26. Preferably, this physical contact is achieved not only by lateral expansion of the particles within space 28 but also by the flowing of some of the second component comprising the coating onto an exposed surface of the conductor. Particular attention is drawn to the fact that each particle 32 has an individual coating of a conductive material and that the resultant structure, as a result of the intermeshing of first component 32, forms a physical structure which retains its shape upon melting of second component 34.

The following are two examples of the above-described methods and apparatus of the present invention:

EXAMPLE 1

Powder produced in accordance with Example 6 of my above-mentioned U.S. Pat. No. 4,046,643 was used in conjunction with trimmed material from a twenty layer circuit board such as the three layer board basically illustrated in FIG. 1. In the portion used, a surface copper such as copper conductive layer 26 illustrated in FIG. 1, had been etched away. A ⅜ inch wide band of interlayer conductive copper was visible down through a number of the plastic layers. This band was approximately 5 layers down into the circuit board. A pattern of 40 mil holes spaced 3/32 inches apart in a row and ⅛ inches between rows was drilled through the circuit board material using industrial production equipment and a suitable control tape to operate the drill.

The drilled circuit board was then subjected to a standard production schedule wet abrasive slurry blasting to remove any frictional-heat-generated organic decomposition product from the drilled edges of the inner copper layer. The circuit board material, now cleared of so called "drilling smear" was rinsed, air dried, and was then ready for further processing in accordance with the teachings of the present invention.

Four adjacent holes, two in each of two rows, which holes intercepted the just visible internal copper layer were loaded with separate lengths of tinned, copper wire, 8 mils in diameter. The board was placed on a firm surface, and powder produced in accordance with Example 6 of my U.S. Pat. No. 4,046,643 was poured over the holes and then packed into the holes using a blunted tapered copper wire and a hand pressure of about two to five pounds. Electrical continuity was found to exist between the first wire so packed and the copper layer at the edge of the board. The compact was then subjected to heat using a length of copper wire, wrapped around the tip of a 15 watt soldering iron. The copper wire extended approximately ⅛ of an inch beyond the tip of the iron. The untinned copper wire was pressed into the top of the compact to cause melting of the solder as determined by a slight surface softening. After removal of the heat, the compact was tested and found to be a solid and with a high cohesion and continuity between the wire so packed and the internally located copper layer was maintained.

The remaining three holes were treated in a similar fashion with individual wires to establish electrical continuity to the interlayer of copper, as measured from the inserted wires to the edge of the copper layer at the edge of the circuit board.

Additionally, electrical continuity with no resistance detectable on a 1000 ohms/volt Multitester Micronta, Catalogue No. 22-027A, was obtained from wire to wire in any combination or pairs. This demonstration satisfied in all aspects the functional requirements for connection to an inner, buried conductive layer in a production multi-layer circuit board.

EXAMPLE 2

Two different powders were used with a specimen of a three-layer test panel such as that generally illustrated in FIG. 1. Surface copper conductive layers such as layer 26 form surface lands for each of a plurality of holes. A line of internal connected lands was sandwiched between two layers of polytetrafluoroethylene random laid fiberglass roving. The overall thickness of the circuit board was approximately 90 mils and the surface and internal copper layers were each approximately 1.5 mils thick. The surface copper had been overplated with 6 mils of copper before the surface lands were developed. The holes were previously plated with a copper coating. The holes were therefore redrilled and, as noted by continuity testing, were found to be electrically open to the surface lands after re-drilling. Visual inspection after re-drilling also confirmed that the only copper in the holes was that on the edges of the surface lands and at the internal layer, the latter having only a 1.5 mil wide target.

A smaller drill than that used to redrill the holes was rotated by manual movement of fingers back and forth in the holes in the form of a rotary file to clear the edges of the internal conductors of any organic smear caused by the drilling. The circuit board was thereafter ready for interconnection work. Chemical or abrasive blast cleaning of the copper interfaces and chemical modification of the Teflon ®/glass holes surfaces were not employed in this example.

For this example, two sample powders were prepared. The first sample powder was prepared from a 5.2 apparent density powder of generally spherical shape available from Anaconda Corporation. This powder was overplated with a commercially bright copper solution (LEA-RONAL PC GLEAM) with a continuous direct current to a 16% weight increase, using equipment and procedures described in my U.S. Pat. Nos. 3,994,785 and 4,046,643. A minus 200 mesh portion was selected from the first powder sample for use which had the following sieve analysis:

passes 200 but not 230 Mesh: 80% Weight Fraction
passes 230 but not 325 Mesh: 15% Weight Fraction
passes 325 but not Mesh: 5% Weight Fraction A portion of the less than 200 mesh powder was plated at 1.5 volts to an 8% weight increase in a commercial bright solder plating solution LEA-RONAL PLUTIN and 10% of the resulting powder, greater than 100 mesh, was rejected. The increase in mesh size was due primarily to easily broken clamps or clusters. The equipment and methods were again employed in accordance with the teachings of my two above-identified and herein expressly incorporated by reference U.S. Patents and my continuation-in-part Application which has also been herein expressly incorporated by reference.

After rinsing and drying, this powder was ready for use. It is designated as the denser powder. The shape of the particles was observed to be more or less spherical. The powder had an apparent density of 4.3 grams/cm$^3$, the decrease in density from 5.2 grams/cm apparently due to cluster formation.

A second powder was prepared in accordance with the method of U.S. Pat. No. 3,994,785. An aliquot was rinsed and dried then mechanically ground to all passing 200 mesh (2.9 mils), giving:

blocked by 230 Mesh (2.4 mils): 17% Weight Fraction
blocked by 325 Mesh (1.7 mils): 17% Weight Fraction
passes 325 Mesh: 67% Weight Fraction with a composite apparent density of 1.5 gram/cm$^3$.

A portion of this powder, in the original plating solution, was rinsed and transferred to a commercially bright soldering solution and plated at 2.5 volts to provide a 21% weight increase. The powder was rinsed and dried and designated lower density. A measurement of the density or sieve analysis revealed:

passes 60 but not 100 Mesh: 23% Weight Fraction
passes 100 but not 140 Mesh: 12% Weight Fraction
passes 140 but not 200 Mesh: 9% Weight Fraction
passes 200 but not 230 Mesh: 18% Weight Fraction
passes 230 but not 325 Mesh: 11% Weight Fraction
passes 325 Mesh: 28% Weight Fraction with a composite apparent density of 1.40 grams/cm$^3$.

A strip of circuit board panel utilized for this experiment had nine similar holes in one line. The two holes at the end of the line were reserved as controls for later testing. The inner holes were numbered 1-7. The strip had been prepared by standard chemical processing, that is electroless or electrodeposited copper plated through-hole procedures. The holes were first cleaned with a 31 mil drill, employing the drill as a rotary file. Different loading procedures were used for the different holes as indicated below:

Test hole 1—This hole was over drilled to an 80 mil diameter. The hole was then loaded with the denser powder and packed at a compression rate of approximately ½ ton per square inch by using a 75 mil diameter blunt nail and a 4 pound weight rested on the nail head. With the panel in a horizontal position, melted solder was beaded over the top of the hole. The panel was then turned over and a second drop of melted solder was beaded over the newly exposed side of the hole. Thereafter a 40 mil hole was drilled through the compressed particles. A tinned copper wire of approximately 25 mils was inserted through the hole. The panel was turned back to a horizontal position and molten solder was run down the tinned wire using a 15 watt soldering iron. Upon testing it is was determined that continuity was obtained to the inner conductor using this procedure.

Test hole 2—The same procedure was followed as with test hole 1 except the lower density powder was employed. Continuity was again obtained to the inner conductor of the circuit board.

Test hole 3—This test hole was also over drilled to approximately an 80 mil diameter. A 25 mil diameter tinned wire was inserted through the hole without any packing of the wire—that is there was no compression of the wire to distort or buckle the wire into contact with the exposed conductor surface. With the panel in a vertical position and soldering iron contactig the wire, melted solder was wicked into the hole to finally form a bead at one exposed end of the hole and then the position of the soldering iron was moved to the other side of the board and a bead was established on the other exposed end of the hole. Continuity to the inner conductor was not obtained using this method.

Test hole 4—This test hole was over drilled to only 40 mils, a bundle of 7 strands of 10 to 8 milmilrer wire was inserted through the hole, this being the maximum number that could be conveniently inserted. Again the wire was not packed in—that is it was not pushed or distorted to cause the wire to press against the sides of the holes and thus press against the edge of the inner exposed conductors. With the panel in a vertical position, the wires were heated and solder wicked into the hole until beaded at both ends of the hole. Continuity was measured at 500 ohms. At this point holes 1 and 2 were checked and indicated a resistance too low to be read on the continuity meter. Thereafter test hole 4 was rechecked and found to be open without continuity. Apparently the mechanical vibrations developed by retesting holes 1 and 2 caused a break in continuity in test hole 4.

Test hole 5—This hole was also over-drilled to 40 mils and then loaded with the lower density powder produced as set forth above. The hole was thereafter packed with approximately 3.3 tons per square inch of compression using a 28 mil diameter ram and 4.0 pounds of weight. An alternating current of approximately 10 amps was passed through the compressed particles for approximately 90 seconds. Both ends of the hole were burnished with a 125 mil ball rotated with hand applied pressure. An A.C. current of 10 amps was again passed through the compressed particles for approximately 30 seconds. Continuity to the internal conductor was established by this process.

Test hole 6—This test hole was over-drilled to approximately 40 mils. The test hole was loaded with a lower density powder produced as set out above. The powder was packed at approximately 3.3 tons per square inch. The packed powder was burnished at both ends with a 125 mil ball. Solder beads were asserted at both ends of the hole with a 15 watt soldering iron and solder. Continuity was observed as being obtained to the inner circuit layer.

Test hole 7—This test hole was over-drilled to approximately 80 mils diameter and was loaded with the lower density powder. The powder was packed between two 125 mil balls and tapped with a 3 ounce weight. Solder beads were applied to both ends of the hole. The hole was then redrilled with a 40 mil drill. Continuity was observed as being obtained by this procedure to the inner circuit conductor.

In summary of Example 2, continuity was established between surface conductive layers and internal conductors in five different and quantitative procedures using the procedures and apparatus of the present invention. In contrast, test holes 3 and 4 which were modeled upon current shop type procedures, were unsuccessful and vividly demonstrate the necessity of a more sophisticated approach to providing internal connection to circuit board conductor such as is achieved by the teachings of my invention.

In the process of solder beading, a slight sag was noted the end of test hole 1. Since substantial sag would be detrimental to the overall effects sought by the present invention, it was observed that control on the inner action of the base copper particle, the quantity of solder coating and the degree of compaction is highly desirable. It would accordingly be inadvisable to employ a larger quantity of coating with the parameters employed with test hole 1 or a smaller degree of compaction with the parameters employed in test hole 1 for fear of creating a resultant connection which is not suitably resistant to sag upon melting of the solder coating. It is believed that the substitution of dendritic shaped copper particles in place of essentially spherical copper particles would effectively eliminate sag upon melting of the solder coating.

During the course of conducting Example 2, it was noted that an apparent tap density of the powder is an inverse measure of the open space within the uncompressed powder. The greater the opening between the extensions of the powder particles, such as in dendritic powder which is the lowest density form of copper powder, the greater the area of surface contact between the two metals forming the base copper and the solder coating. Upon compression of the resulting plug, the lower the original powder tap density, the greater the intertwining of the base copper and the solder coating. Hence, for the same volume plug, it is believed that the lower the starting powder density the greater will be the frictional resistance to fluid flow of the molten solder coating and hence the less the tendancy to sag through flow or slip upon melting of the solder coating. A lower density starting powder after compaction is believed to have more but finer pores through which the molten solder may flow and hence exhibits a greater frictional resistance to flow and to distortion.

It should be noted that the methods and apparatus taught by the present invention are useful in cases where there is chemical incompatability between the materials comprising the circuit board and the chemical baths used to obtain copper plating in the holes under prior art teachings. For example, a prior art seed coat of about 0.020 mils is required as a conductive layer before copper can be electrodeposited on the internal surfaces of a hole to build a 1 mil cover over the exposed plastic surfaces of a circuit board. The seed coat of copper is first deposited on the walls in an alkaline solution. The alkaline solution reacts with acrylic adhesives to swell them, displacing or fracturing the first conductive layer. In addition, the required seed coat of the prior art processes will not adhere to a Teflon ® base material.

The new method is also useful where the drilling of the holes has created a rough, fragile or fractured surface, which is an unstable base for the prior art seed coat. With a rough surface the seed coat area is increased many fold, and hence the plating current is very much greater than normal at the points of contact. Accordingly, the initial current can be so great that it blasts or burns off the seed coat.

The prior art methods of electroplating copper on the hole wall can also lead to voids in the hole wall plating, delamination by chemical attacks on layers of the circuit boards, pocket retention of liquids, opening of internal connections upon thermal cycling, and/or excursion of adhesives during plating.

Particular advantages of the present invention include the fact that it is usable with materials which are incompatible with the copper electroless/electroplate process; it eliminates two chemical production process lines, namely the chemical desmear-etch back and electroless copper de-position lines; it provides for flexibility for device design and later assembly; it provides increased project insurance of bond to inner layers; and it can be automated and is easily repairable.

Additional advantages and modifications will readily occur to those skilled in the art. The invention in its broader aspects is therefore not limited to the specific details, representative processes, and illustrative examples shown and described. Accordingly, departures may be made from such details without departing from the spirit or scope of applicant's generally inventive concept.

What is claimed is:

1. A method for making an electrical circuit connection to at least one conductor which conductor has an exposed surface defining in part an at least partially enclosed space, said method comprising the steps of:
   (a) loading discrete composition particles into said space, said composition particles each comprising first and second electrically conductive components, said second component having a lower melting point than said first component and said second component having less than a 10 to 100 ratio by weight to said first component in said particles to avoid becoming a lubricant upon melting of said second component;
   (b) asserting pressure to said composition particles to contact said exposed surface of said conductor with said composition particles and to achieve a coherent unit which resists the sagging of either of said first and second components under the force of gravity upon the melting of only said second component;
   (c) heating said particles to melt only said second component sufficiently to allow at least a portion of said second component to flow onto said exposed surface of said conductor and yet avoid sag of said first component; and
   (d) cooling said particles to form a rigid electrical and mechanical connection between said conductor and said compact.

2. The method of claim 1 wherein said step of asserting pressure is continued at least until there is lateral expansion of said compact within said space.

3. The method of claim 1 wherein said step of loading includes selecting composition particles in which said first component is a first metal having a first melting point and said second component is a second metal having a second lower melting point.

4. The method of claim 1 wherein said step of loading includes selecting composition particles in which said first component is a first metal having a first melting point and said second component is an alloy having a second lower melting point.

5. The method of claim 1 wherein said step of loading includes selecting composition particles in which said first component is copper and said second component is a tin and lead solder.

6. The method of claim 1 wherein said step of loading includes selecting composition particles in which said first component is brass and said second component is a tin and lead solder.

7. The method of claim 1 wherein said step of loading includes selecting composition particles which particles are dendritic in shape.

8. A method for making an electrical circuit connection to at least one conductor which conductor has an exposed surface defining in part an at least partially enclosed space, said method comprising the steps of:
  (a) loading discrete composition particles into said space, said composition particles each comprising first and second electrically conductive components, said second component having a lower melting point than said first component and said second component having less than a 10 to 100 ratio by weight to said first component in said particles to avoid becoming a lubricant upon melting of said second component;
  (b) asserting pressure to said composition particles to contact said exposed surface of said conductor with said composition particles and to achieve a coherent unit which resists the sagging of either of said first and second components under the force of gravity upon the melting of only said second component;
  (c) heating said particles to melt only said second component sufficiently to allow at least a portion of said second component to flow onto said exposed surface of said conductor and yet avoid sag of said first component;
  (d) cooling said particles to form a rigid electrical and mechanical connection between said conductor and said compact; and
  (e) mounting an electrical device to said unit.

9. The method of claim 8 wherein said step of mounting includes the substeps of drilling a hole into said particles after said step of cooling, inserting a conductive portion of said electrical device into said hole, reheating said particles to melt only said second component sufficiently to allow at least a portion of said second component to flow onto said conductive portion of said electrical device, and cooling said particles to form a rigid electrical and mechanical connection between said conductor and said electrical device.

10. The method of claim 9 wherein said step of mounting further includes the substep of introducing an additional conductive component into said hole adjacent said conductive portion of said electrical device.

11. The method of claim 8 wherein said step of mounting includes the substep of inserting a conductive portion of said electrical device into said space prior to said step of forming said unit said step of heating including heating said particles sufficiently to also allow at least a portion of said second component to flow onto said conductive portion of said electrical device; and said step of cooling said particles further forms a rigid electrical and mechanical connection between said conductor and said electrical device.

12. The method of claim 11 wherein said step of mounting further includes the substep of introducing an additional conductive component into said hole adjacent said conductive portion of said electrical device.

13. A method for making an electrical circuit connection to at least one conductor which conductor has an exposed surface and which surface in part defines an at least partially enclosed space, said method comprising:
  (a) loading copper particles into said space, said particles each having a dendritic core and an individual non-lubricating coating of solder over said core producing a dendritic solder coated copper particle, said coating having a lower melting point than the melting point of said core;
  (b) compacting said particles sufficiently to assure physical contact of at least a portion of said coating of at least some of said particles with said exposed surface of said conductor and to establish a cohesive unit by interweaving of said particles, which unit will not sag upon melting of said coating;
  (c) heating said particles to melt only said coating of said particles sufficiently to allow at least a portion of said coating to flow onto said exposed surface of said conductor and yet avoid sag of said unit; and
  (d) cooling said particles to form a rigid electrical and mechanical connection between said conductor and said unit.

14. The method of claim 13 wherein said step of compacting is continued at least until there is lateral expansion of said compact within said space.

15. A method for making an electrical circuit connection to at least one conductor which conductor has an exposed surface and which surface in part defines an at least partially enclosed space and to an electrical device, said method comprising:
  (a) loading copper particles into said space, said particles each having a dendritic core and an individual non-lubricating coating of solder over said core producing a dendritic solder coated copper particle, said coating having a lower melting point than the melting point of said core;
  (b) compacting said particles sufficiently to assure physical contact of at least a portion of said coating of at least some of said particles with said exposed surface of said conductor and to establish a cohesive unit by interweaving of said particles which unit will not sag upon melting of said coating;
  (c) heating said particles to melt only said coating of said particles sufficiently to allow at least a portion of said coating to flow onto said exposed surface of said conductor and yet avoid sag of said unit;
  (d) cooling said particles to form a rigid electrical and mechanical connection between said conductor and said unit; and
  (e) mounting an electrical device to said unit.

16. The method of claim 15 wherein said step of mounting includes the substep of inserting a conductive portion of said electrical device into said space prior to said step of compacting; said step of heating including heating said particles sufficiently to also allow at least a portion of said coating to flow onto said conductive portion of said electrical device; and said step of cooling said particles further forms a rigid electrical and mechanical connection between said conductor and said electrical device.

17. A method for making an electrical circuit connection to at least one conductor which conductor has an exposed surface and which surface in part defines an at least partially enclosed space, said method comprising the steps of:
  (a) compacting an electrically conductive filament into said space, said filament having a coating of a material which exhibits a lower melting point than the melting point of said filament, said compacting continuing until at least a substantial portion of said space is filled with a random distribution of said filament sufficiently dense to assure physical contact of some portion of said coating with said exposed surface of said conductor and to assure that said filament will not sag upon melting of only said coating;

(b) heating said random distribution to melt only said coating sufficiently to allow at least a portion of said material of said coating to flow onto said exposed surface of said conductor; and (c) cooling said random distribution to form a rigid electrical and mechanical connection between said conductor and said compact.

18. A method for making an electrical circuit connection to at least one conductor which conductor has an exposed surface and which surface in part defines an at least partially enclosed space and to an electrical device, said method comprising the steps of:

(a) heating composition particles, which particles comprise first and second electrically conductive components with said second component having a lower melting point than said first component, sufficient to melt only said second component;

(b) loading said heated particles into said space in a random distribution;

(c) compacting said heated particles to form a compact which does not sag upon said second component being melted and to assure that at least a portion of said second component flows onto said exposed surface of said conductor;

(d) cooling said particles to form a rigid electrical and mechanical connection between said conductor and said compact; and (e) mounting said electrical device to said compact.

19. The method of claim 18 wherein said step of mounting includes the substeps of drilling a hole into said particles after said step of cooling, inserting a conductive portion of said electrical device into said hole, reheating said particles to melt only said second component sufficiently to allow at least a portion of said second component to flow onto said conductive portion of said electrical device, and cooling said particles to form a rigid electrical and mechanical connection between said conductor and said electrical device.

20. The method of claim 19 wherein said step of mounting further includes the substep of introducing an additional conductive component adjacent said conductive portion of said electrical device.

21. The method of claim 18 wherein said step of mounting includes the substep of inserting a conductive portion of said electrical device into said space prior to said step of compacting; said step of compacting further assures at least a portion of said second component flows onto said conductive portion of said electrical device; and said step of cooling said particles further forms a rigid electrical and mechanical connection between said conductor and said electrical device.

22. The method of claim 21 wherein said step of mounting further includes the substep of introducing an additional conductive component adjacent said conductive portion of said electrical device.

23. A method for making an electrical circuit connection to at least one conductor which conductor has an exposed surface defining in part an at least partially enclosed space and to at least one electrical device, said method comprising the steps of:

(a) loading discrete composition particles into said space, said composition particles each comprising first and second electrically conductive components, said second component having a lower melting point than said first component;

(b) forming a compact of said particles for contacting said exposed surface of said conductor with said composition particles and for resisting the sagging of either of said first and second components under the force of gravity upon the melting of only said second component;

(c) heating said particles to melt only said second component sufficiently to allow at least a portion of said second component to flow onto said exposed surface of said conductor;

(d) cooling said particles to form a rigid electrical and mechanical connection between said conductor and said compact; and (e) mounting an electrical device to said compact, wherein said step of mounting includes the substeps of drilling a hole into said particles after said step of cooling, inserting a conductive portion of said electrical device into said hole, reheating said particles to melt only said second component sufficiently to allow at least a portion of said second component to flow onto said conductive portion of said electrical device, and cooling said particles to form a rigid electrical and mechanical connection between said conductor and said electrical device.

24. The method of claim 23 wherein said step of mounting further includes the substep of introducing an additional conductive component into said hole adjacent said conductive portion of said electrical device.

25. A method for making an electrical circuit connection to at least one conductor which conductor has an exposed surface defining in part an at least partially enclosed space and to at least one electrical device, said method comprising the steps of:

(a) loading discrete composition particles into said space, said composition particles each comprising first and second electrically conductive components, said second component having a lower melting point than said first component;

(b) forming a compact of said particles for contacting said exposed surface of said conductor with said composition particles and for resisting the sagging of either of said first and second components under the force of gravity upon the melting of only said second component;

(c) heating said particles to melt only said second component sufficiently to allow at least a portion of said second component to flow onto said exposed surface of said conductor;

(d) cooling said particles to form a rigid electrical and mechanical connection between said conductor and said compact; and (e) mounting an electrical device to said compact, where said step of mounting includes the substep of inserting a conductive portion of said electrical device into said space prior to said step of forming a compact said step of heating including heating said particles sufficiently to also allow at least a portion of said second component to flow onto said conductive portion of said electrical device; and said step of cooling said particles further forms a rigid electrical and mechanical connection between said conductor and said electrical device; and wherein said step of mounting further includes the substep of introducing an additional conductive component adjacent said conductive portion of said electrical device.

26. A method for making an electrical circuit connection to at least one conductor which conductor has an exposed surface and which surface in part defines an at least partially enclosed space, said method comprising:

(a) loading copper particles into said space, said particles having an apparent density of approximately 1.5 grams per cubic centimeter and each having a dendritic core and an individual non-lubricating coating of solder over said core producing a dendritic solder coated copper particle, said coating having a lower melting point than the melting point of said core;

(b) compacting said particles sufficiently to assure physical contact of at least a portion of said coating of at least some of said particles with said exposed surface of said conductor and to establish a cohesive unit by interweaving of said particles, which unit will not sag upon melting of said coating;

(c) heating said particles to melt only said coating of said particles sufficiently to allow at least a portion of said coating to flow onto said exposed surface of said conductor and yet avoid sag of said unit; and (d) cooling said particles to form a rigid electrical and mechanical connection between said conductor and said unit.

27. The method of claim 26 wherein said non-lubricating coating of solder provides approximately a 21 percent weight increase to said particles.

28. A method for making an electrical circuit connection to at least one conductor which conductor has an exposed surface and which surface in part defines an at least partially enclosed space, said method comprising:

(a) loading copper particles into said space, said particles each having a dendritic core and an individual non-lubricating coating of solder over said core producing a dendritic solder coated copper particle, said coating having a lower melting point then the melting point of said core and providing approximately a 21 percent weight increase to said particles;

(b) compacting said particles sufficiently to assure physical contact of at least a portion of said coating of at least some of said particles with said exposed surface of said conductor and to establish a cohesive unit by interweaving of said particles, which unit will not sag upon melting of said coating;

(c) heating said particles to melt only said coating of said particles sufficiently to allow at least a portion of said coating to flow onto a exposed surface of said conductor and yet avoid sag of said unit; and (d) cooling said particles to form a rigid electrical and mechanical connection between said conductor and said unit.

29. A method for making an electrical circuit connection to at least one conductor which conductor has an exposed surface and which surface in part defines an at least partially enclosed space, said method comprising:

(a) loading copper particles into said space, said particles each having a dendritic core and an individual non-lubricating coating of solder over said core producing a dendritic solder coated copper particle, said coating having a lower melting point than the melting point of said core;

(b) compacting said particles by applying between approximately 0.5 to 3.3 tons per square inch pressure to said particles to assure physical contact of at least a portion of said coating of at least some of said particles with said exposed surface of said conductor and to establish a cohesive unit by interweaving of said particles, which unit will not sag upon melting of said coating;

(c) heating said particles to melt only said coating of said particles sufficiently to allow at least a portion of said coating to flow onto said exposed surface of said conductor and yet avoid sag of said unit, said coating to flow onto said exposed surface of said conductor and yet avoid sag of said unit; and (d) cooling said particles to form a rigid electrical and mechanical connection between said conductor and said unit.

30. The method of claims 27, 26 or 28 wherein said step of compacting comprises the application of between approximately 0.5 and 3.3 tons per square inch pressure to said particles.

31. A method for making an electrical circuit connection to at least one conductor which conductor has an exposed surface and which surface in part defines an at least partially enclosed space and to an electrical device, said method comprising:

(a) loading copper particles into said space, said particles each having a dendritic core and an individual non-lubricating coating of solder over said core producing a dendritic solder coated copper particle, said coating having a lower melting point than the melting point of said core;

(b) compacting said particles sufficiently to assure physical contact of at least a portion of said coating of at least some said particles with said exposed surface of said conductor and to establish a cohesive unit by interweaving of said particles, which unit will not sag upon melting of said coating;

(c) heating said particles to melt only said coating of said particles sufficiently to allow at least a portion of said coating to flow onto said exposed surface of said conductor and yet avoid sag of said unit;

(d) cooling said particles to form a rigid electrical and mechanical connection between said conductor and yet avoid sag of said unit; and (e) mounting an electrical device to said unit including the steps of drilling holes into said particles after said step of cooling, inserting a conductive portion of said electrical device into said hole, reheating said particles to melt only said coating sufficiently to allow at least a portion of said coating to flow onto said conductive portion of said electrical device, and cooling said particles to form a rigid electrical and mechanical connection between said conductor and said electrical device.

32. The method of claim 31 wherein said step of mounting further includes the substep of introducing an additional conductive component into said hole adjacent said conductive portion of said electrical device.

33. A method for making an electrical circuit connection to at least one conductor which conductor has an exposed surface and which surface in part defines an at least partially enclosed space and to an electrical device, said method comprising:

(a) loading copper particles into said space, said particles each having a dendritic core and an individual non-lubricating coating of solder over said core producing a dendritic solder coated copper particle, said coating having a lower melting point than the melting point of said core;

(b) compacting said particles sufficiently to assure physical contact of at least a portion of said coating of at least some of said particles with said exposed surface of said conductor and to establish a cohesive unit by interweaving of said particles, which unit will not sag upon melting of said coating;

(c) heating said particles to melt only said coating of said particles sufficiently to allow at least a portion of said coating to flow onto a conductive portion of said electrical device, and also to allow at least a portion of said coating to flow onto a exposed surface of said conductor and yet avoid sag of said unit;

(d) cooling said particles to form a rigid electrical and mechanical connection between said conductor and said unit and between said conductor and said electrical device; and (e) mounting an electrical device to said unit including the steps of inserting a conductive portion of said electrical device into said space prior to said step of compacting and introducing an additional component into said hole adjacent said conductive portion of said electrical device.

* * * * *